US012597910B2

(12) United States Patent　　(10) Patent No.:　US 12,597,910 B2

Ella et al.　　(45) Date of Patent:　Apr. 7, 2026

(54) CIRCULATOR FOR FULL DUPLEX COMMUNICATIONS

(71) Applicant: QUALCOMM Incorporated, San Diego, CA (US)

(72) Inventors: Juha Sakari Ella, Turku (FI); Edgar Schmidhammer, Stein an der Traun (DE)

(73) Assignee: QUALCOMM Incorporated, San Diego, CA (US)

( * ) Notice: Subject to any disclaimer, the term of this patent is extended or adjusted under 35 U.S.C. 154(b) by 125 days.

(21) Appl. No.: 18/426,118

(22) Filed: Jan. 29, 2024

(65) Prior Publication Data

US 2025/0247077 A1　Jul. 31, 2025

(51) Int. Cl.
H03H 9/25　　(2006.01)
H03H 3/02　　(2006.01)
*H04L 5/14*　　(2006.01)

(52) U.S. Cl.
CPC ............... H03H 9/25 (2013.01); H03H 3/02 (2013.01); *H04L 5/14* (2013.01)

(58) Field of Classification Search
CPC .... H03H 9/6403; H03H 9/542; H03H 9/6483; H03H 9/72; H03H 9/725; H03H 9/14541; H03H 9/706; H03H 9/64; H03H 9/605; H03H 7/0115; H03H 9/568; H03H 9/25; H03H 7/461; H03H 9/6406; H03H 7/01; H03H 2210/036; H03H 9/14544; H03H 9/6489; H03H 7/46; H03H 9/0542; H03H 9/46; H03H 7/0161; H03H 7/075; H03H 2210/012; H03H 2250/00; H03H 9/703; H03H 9/02007; H03H 9/145; H03H 9/205; H03H 9/54; H03H 7/1783; H03H 7/38; H03H 9/02637; H03H 9/02866; H03H 9/0566; H03H 9/14582; H03H 11/04; H03H 11/34; H03H 7/175; H03H 7/1766; H03H 9/02228; H03H 9/02275; H03H 9/02818; H03H 9/02834; H03H 9/14538; H03H 9/1455; H03H 17/00; H03H 2017/0081; H03H 2017/009; H03H 9/02102; H03H 9/14502; H03H 9/171; H03H 9/545;

(Continued)

(56) References Cited

U.S. PATENT DOCUMENTS 8,891,596 B2　11/2014　Hayafuji et al.
9,660,611 B2　5/2017　Burgener et al.

(Continued)

OTHER PUBLICATIONS

Hummel G.E., et al., "Germanium Telluride Chalcogenide Switches for RF Applications", Sandia National Laboratories, 2021, pp. 1-70.

(Continued)

*Primary Examiner* — John W Poos
(74) *Attorney, Agent, or Firm* — Patterson + Sheridan LLP

(57)　　ABSTRACT

An example circulator generally includes a plurality of branches. Each of the branches includes a first acoustic wave resonator and a second acoustic wave resonator coupled in series with the first acoustic wave resonator. Each of the branches further includes a first switching device and a second switching device. The first switching device is coupled in parallel with the first acoustic wave resonator. The second switching device is coupled in parallel with the second acoustic wave resonator.

18 Claims, 8 Drawing Sheets

(58) Field of Classification Search

CPC .. H03H 7/463; H03H 9/02157; H03H 9/0547; H03H 9/547; H03H 9/6493; H03H 9/70; H03H 11/1291; H03H 19/002; H03H 19/004; H03H 2007/013; H03H 2009/02204; H03H 2009/155; H03H 2210/025; H03H 2210/026; H03H 3/02; H03H 7/0153; H03H 7/06; H03H 7/12; H03H 7/17; H03H 7/1741; H03H 7/325; H03H 9/0004; H03H 9/02015; H03H 9/02031; H03H 9/15; H03H 9/175; H03H 9/38; H03H 9/423; H03H 9/48; H03H 9/52; H03H 9/584; H03H 9/585; H03H 9/587; H03H 9/588; H03H 9/589; H03H 9/60; H03H 9/6423; H03H 9/6479; H03H 9/66; H04B 1/40; H04B 1/0057; H04B 7/15542; H04B 1/525; H04B 1/44; H04B 7/15535; H04B 1/0458; H04B 7/15528; H04B 1/006; H04B 1/38; H04B 7/15507; H04B 1/0053; H04B 1/22; H04B 1/04; H04B 1/20; H04B 2001/0416; H04B 7/15557; H04B 1/00; H04B 17/318; H04B 1/0078; H04B 1/0096; H04B 7/0825; H04B 7/2606; H04B 1/1036; H04B 1/50; H04B 1/0483; H04B 1/18; H04B 2001/0408; H04B 2001/1063; H04B 7/155; H04B 7/14; H04B 7/15578; H04B 1/403; H04B 10/2575; H04B 10/29; H04B 7/026; H04B 7/0617; H04B 7/0845; H04B 7/088; H04B 7/18513; H04B 7/18517; H04B 7/18534; H04B 1/005; H04B 17/13; H04B 17/14; H04B 17/24; H04B 17/40; H04B 7/0695; H04B 1/0067; H04B 1/0475; H04B 1/10; H04B 1/401; H04B 1/405; H04B 1/406; H04B 1/48; H04B 1/52; H04B 1/7093; H04B 2001/70935; H04B 7/1555; H04W 4/38; H04W 4/70; H04W 4/80; H04W 4/35; H04W 16/26; H04W 12/06; H04W 88/08; H04W 88/06; H04W 84/12; H04W 88/085; H04W 12/026; H04W 84/047; H04W 16/28; H04W 72/0453; H04W 12/08; H04W 52/52; H04W 12/04; H04W 52/0274; H04W 40/02; H04W 12/50; H04W 28/06; H04W 84/18; H04W 52/16; H04W 52/223; H04W 52/286; H04W 52/34; H04W 52/246; H04W 52/362; H04W 72/0446; H04W 92/20; H04W 12/68; H04W 12/72; H04W 4/021; H04W 76/10; H04W 12/062; H04W 64/00; H04W 72/04; H04W 88/07; H04W 24/02; H04W 40/22; H04W 48/16; H04W 52/028; H04W 16/14; H04W 16/18; H04W 4/06; H04W 52/0245; H04W 72/20; H04W 88/02; H04W 4/02; H04W 56/001; H04W 40/08; H04W 52/0209; H04W 52/0216; H04W 68/00; H04W 72/541; H04W 74/04; H04W 8/18; H04W 8/26; H04W 84/022; H04W 84/045; H04W 88/022; H04W 88/026; H04W 88/185; H04W 88/187; H04W 56/0015; H04W 56/0025; H04W 88/10; H04W 12/068; H04W 16/20; H04W 52/0254; H04W 16/24; H04W 36/304; H04W 4/029; H04W 4/33; H04W 4/48; H04W 52/0261; H04W 52/42; H04W 56/0035; H04W 76/15; H04W 84/06; H04W 88/04; H04W 4/21; H04W 4/40; H04W 4/90; H04W 52/0229; H04W 52/0258; H04W 52/243; H04W 60/00; H04W 8/005; H04W 28/04; H04W 36/142; H04W 4/026; H04W 4/027; H04W 4/18; H04W 4/185; H04W 52/0206; H04W 52/0238; H04W 52/247; H04W 72/0473; H04W 72/29; H04W 72/542; H04W 92/02

See application file for complete search history.

(56) References Cited

U.S. PATENT DOCUMENTS

| | | | | |
|---|---|---|---|---|
| 2011/0299432 | A1* | 12/2011 | Caron | H04B 1/52 |
| | | | | 370/277 |
| 2018/0138889 | A1* | 5/2018 | Rinaldi | H03H 9/171 |
| 2020/0136592 | A1* | 4/2020 | Nosaka | H03H 9/6403 |
| 2020/0235720 | A1* | 7/2020 | Nosaka | H03H 9/6406 |

OTHER PUBLICATIONS

Kord A., et al., "CMOS Integrated Magnetless Circulators Based on Spatiotemporal Modulation Angular-Momentum Biasing", IEEE Transactions on Microwave Theory and Techniques, vol. 67, No. 7, Jul. 2019, pp. 2649-2662.

Pirro M., et al., "Low Loss Non-Reciprocal Filter for Miniaturized RF-Front-End Platforms", Joint Conference of the IEEE International Frequency Control Symposium and European Frequency and Time Forum (EFTF/IFC), Apr. 14-18, 2019, 3 pages.

Torunbalci M.M., et al., "An FBAR Circulator", IEEE Microwave and Wireless Components Letters, vol. 28, No. 5, May 2018, pp. 1-3.

Yu Y., et al., "Highly-Linear Magnet-Free Microelectromechanical Circulators", Journal of Microelectromechanical Systems, vol. 28, No. 6, Dec. 2019, pp. 933-940.

Yu Y., et al., "Magnetic-free Radio Frequency Circulator Based on Spatiotemporal Commutation of MEMS Resonators", IEEE Micro Electro Mechanical Systems (MEMS), Jan. 21-25, 2018, pp. 154-157.

International Search Report and Written Opinion—PCT/US2024/059839—ISA/EPO—Mar. 7, 2025.

* cited by examiner

300

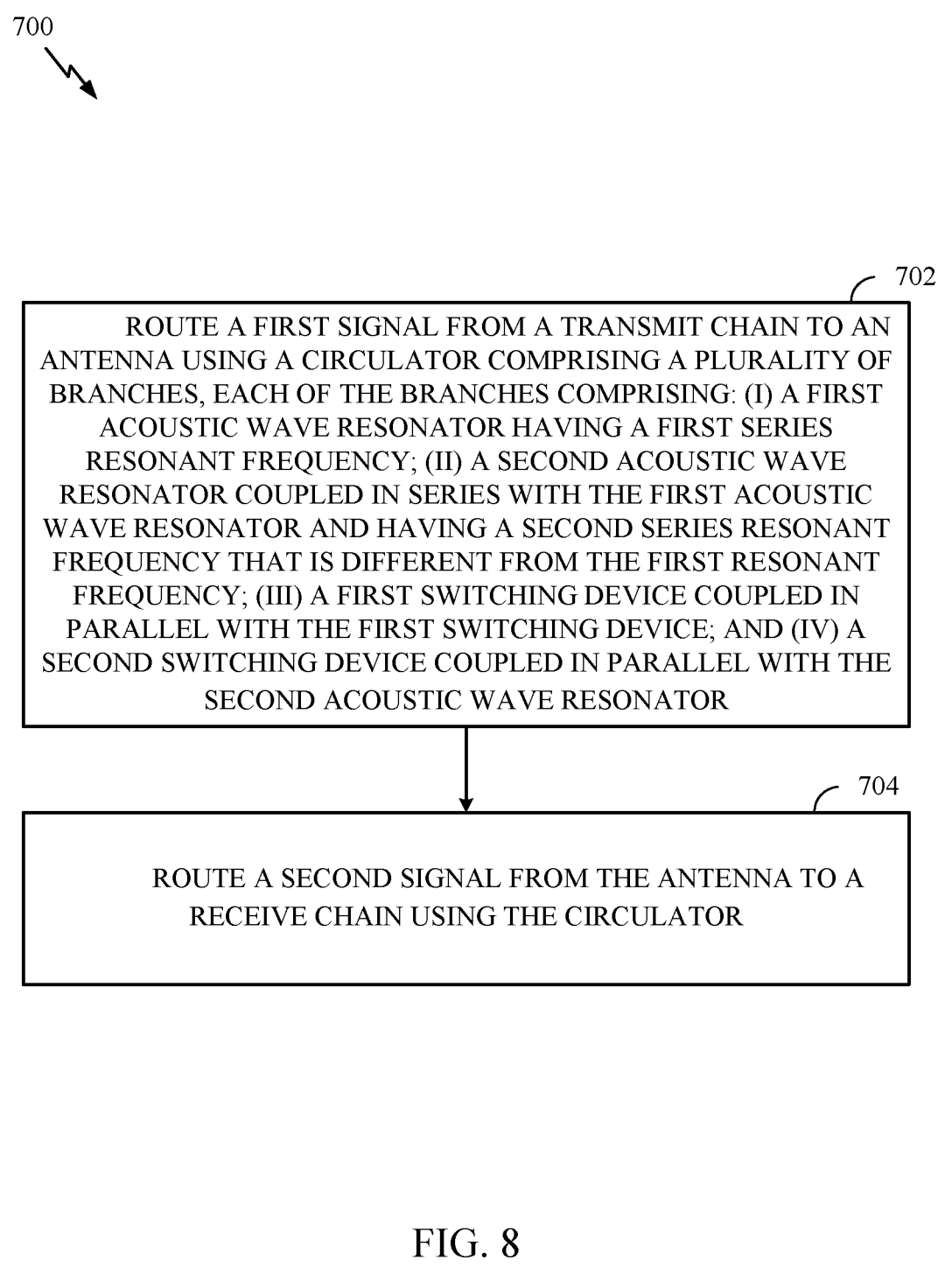

700

702

ROUTE A FIRST SIGNAL FROM A TRANSMIT CHAIN TO AN ANTENNA USING A CIRCULATOR COMPRISING A PLURALITY OF BRANCHES, EACH OF THE BRANCHES COMPRISING: (I) A FIRST ACOUSTIC WAVE RESONATOR HAVING A FIRST SERIES RESONANT FREQUENCY; (II) A SECOND ACOUSTIC WAVE RESONATOR COUPLED IN SERIES WITH THE FIRST ACOUSTIC WAVE RESONATOR AND HAVING A SECOND SERIES RESONANT FREQUENCY THAT IS DIFFERENT FROM THE FIRST RESONANT FREQUENCY; (III) A FIRST SWITCHING DEVICE COUPLED IN PARALLEL WITH THE FIRST SWITCHING DEVICE; AND (IV) A SECOND SWITCHING DEVICE COUPLED IN PARALLEL WITH THE SECOND ACOUSTIC WAVE RESONATOR

704

ROUTE A SECOND SIGNAL FROM THE ANTENNA TO A RECEIVE CHAIN USING THE CIRCULATOR

FIG. 8

CIRCULATOR FOR FULL DUPLEX COMMUNICATIONS

TECHNICAL FIELD

Certain aspects of the present disclosure generally relate to a circulator and use of the circulator to route signals in electronic devices that support wireless communications.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A mobile station may transmit data and control information on the uplink to a base station and/or may receive data and control information on the downlink from the base station. The base station and/or mobile station may include a circulator, which may be used to share an antenna between a transmit chain for processing signals for wireless transmission and a receive chain for processing wirelessly received signals.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include a circulator having two or more fixed frequency resonators that are toggled using switching elements that are coupled in parallel with each respective resonator, thereby eliminating the need for lossy and/or non-linear circuit elements included in conventional circulators and needed to modify the resonant frequency of a single resonator.

Certain aspects of the present disclosure provide a circulator. The circulator generally includes a plurality of branches. Each of the branches comprises a first acoustic wave resonator and a second acoustic wave resonator coupled in series with the first acoustic wave resonator. Each of the branches further comprises a first switching device coupled in parallel with the first acoustic wave resonator and a second switching device coupled in parallel with the second acoustic wave resonator.

Certain aspects of the present disclosure provide a method of wireless communication. The method generally includes routing a first signal from a transmit chain to an antenna using a circulator comprising a plurality of branches, each of the branches comprising a first acoustic wave resonator having a first series resonant frequency, a second acoustic wave resonator coupled in series with the first acoustic wave resonator and having a second series resonant frequency that is different from the first series resonant frequency, a first switching device coupled in parallel with the first acoustic wave resonator, and a second switching device coupled in parallel with the second acoustic wave resonator. The method further includes routing a second signal from the antenna to a receive chain using the circulator.

Certain aspects of the present disclosure provide an apparatus. The apparatus generally includes a transmit chain, a receive chain, and an antenna. The apparatus further includes a first port coupled to the transmit chain, a second portion coupled to the antenna, and a third port coupled to the receive chain. The circulator further includes a plurality of branches. Each of the branches comprises a first acoustic wave resonator and a second acoustic wave resonator coupled in series with the first acoustic wave resonator. Each of the branches further comprises a first switching device coupled in parallel with the first acoustic wave resonator and a second switching device coupled in parallel with the second acoustic wave resonator.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 8 is a flow diagram of example operations for operating a circulator, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
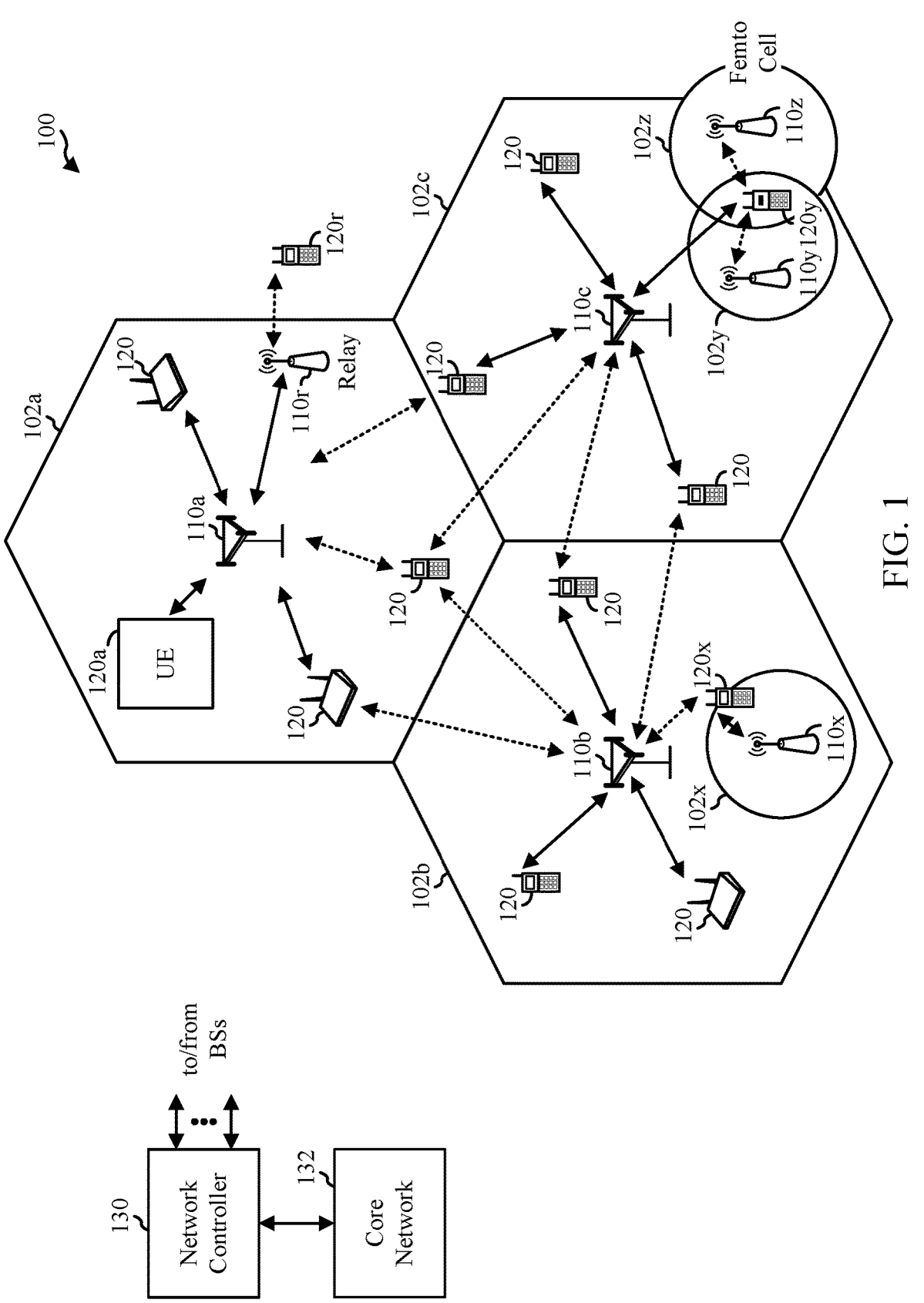
FIG. 1 is a diagram of an example wireless communications network, in which aspects of the present disclosure may be practiced.

Certain aspects of the present disclosure relate to circulators that are used in devices to allow radio frequency signals to travel along one path (e.g., transmit path or receive path) while blocking the radio frequency signals from traveling along a different path (e.g., the other of the transmit path or receive path). A circulator according to aspects of the present disclosure includes a plurality of branches, with each of the branches including a first acoustic wave resonator, a second acoustic wave resonator coupled in series with the first acoustic wave resonator, a first switching device coupled in parallel with the first acoustic wave resonator, and a second switching device coupled in parallel with the second acoustic wave resonator. The first switching device and the second switching device may be operated in an alternating manner such that only one acoustic wave resonator in each of the branches is active at a time. This arrangement eliminates the need for lossy and/or non-linear circuit elements that are included in conventional circulators to modify the resonant frequency of a single resonator.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) or later NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, Nan UEs may be selected for simultaneous transmission on the downlink. $N_{up}$ may or may not be equal to $N_{dn}$, and $N_{up}$ and Nan may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a circulator, as described in more detail herein.

Figure 2:
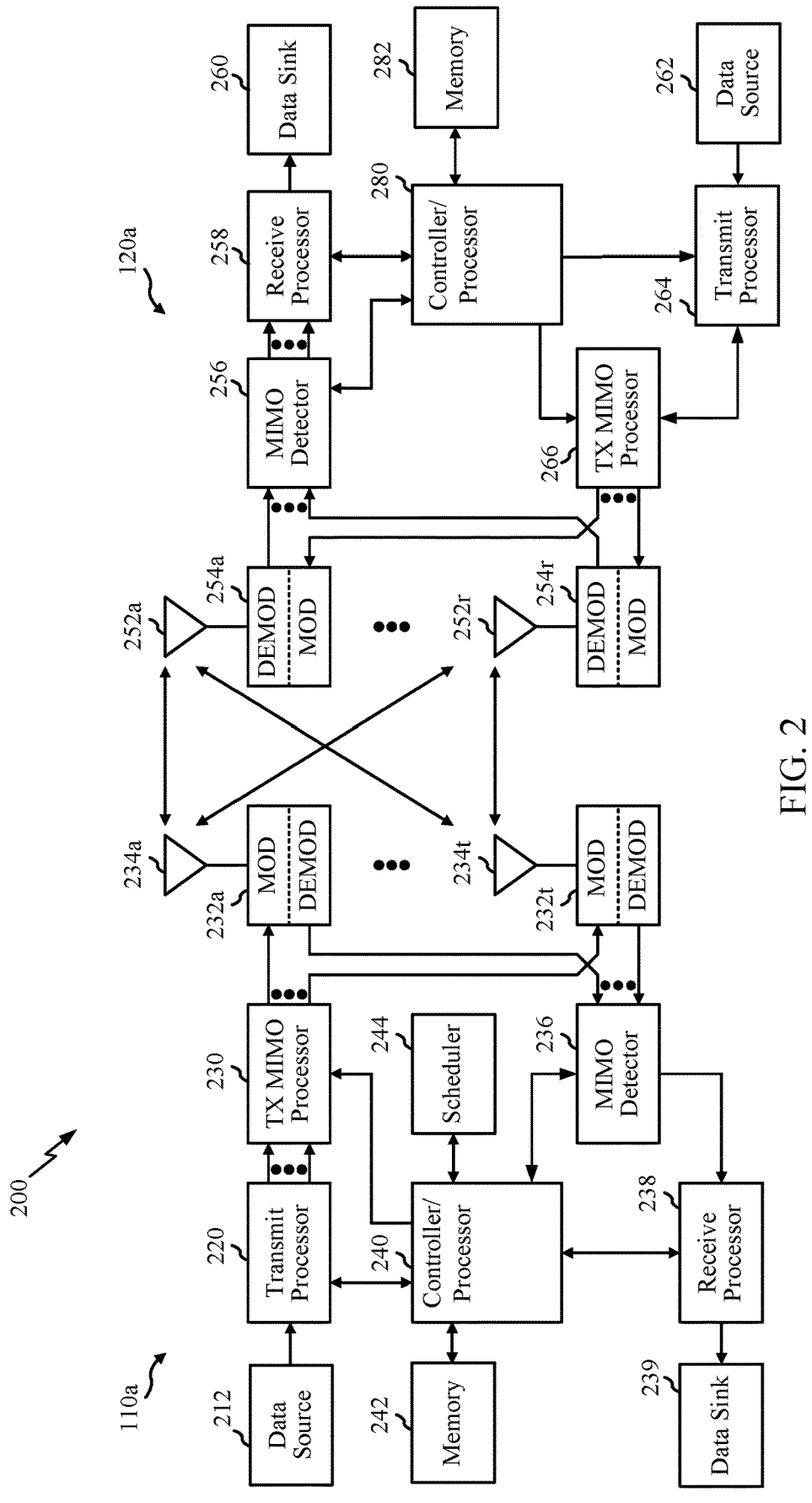
FIG. 2 is a block diagram conceptually illustrating a design of an example a base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs). While the discussion of the NR has been limited to half-duplex operations, it should be understood that the NR may also support full-duplex operations, such as single frequency full-duplex (SFFD), that are associated with other wireless communication schemes.

In certain aspects of the present disclosure, the transceivers 232 and/or the transceivers 254 may include a circulator, as described in more detail herein.

Example RF Transceiver

Figure 3:
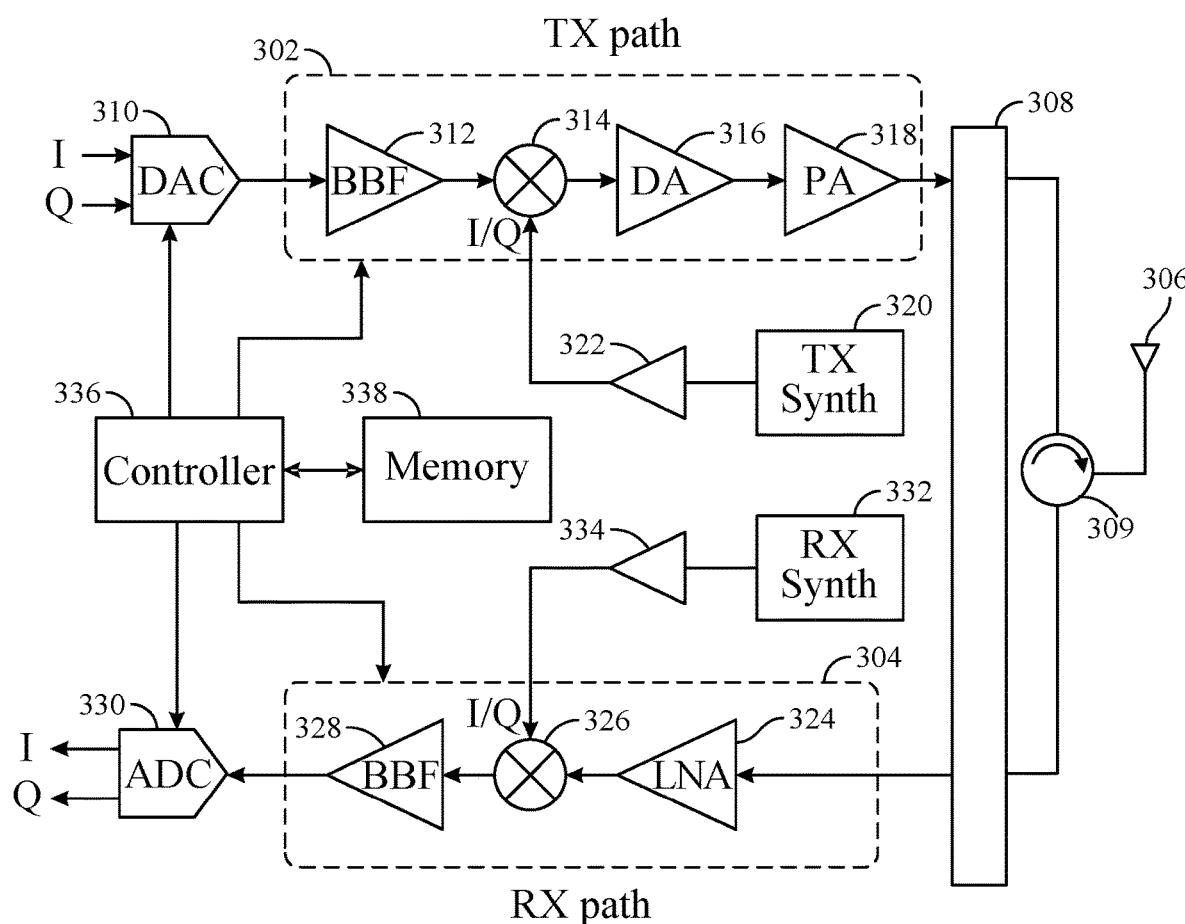
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes a transmit (TX) path 302 (also known as a "transmit chain") for transmitting signals via an antenna 306 and a receive (RX) path 304 (also known as a "receive chain") for receiving signals via antennas 306. The RF transceiver circuit 300 includes an interface 308 that connects each of the transmit path 302 and the receive path 304 to the antenna 306. The interface 308 may, for example, include wideband RF cancellation circuitry. The RF transceiver circuit 300 includes a circulator 309 coupled to the interface 308 and the antenna 306. The circulator 309 routes a first signal (e.g., transmit signal) for transmission from the transmit path 302 to the antenna 306 and routes a second signal (e.g., receive signal) for reception from the antenna 306 to the receive path 304. It should be understood that the circulator 309 isolates the transmit path 302 from the receive path 304 when routing the first signal from the transmit path 302 to the antenna 306. It should also be understood that the circulator 309 isolates the antenna receive path 304 from the transmit path 302 when routing the second signal from the antenna 306 to the receive path 304.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the DAC 310 may be implemented by any of various suitable high-speed DAC topologies, such as a current-steering DAC. The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used as a circulator in any of various other suitable systems.

Example Circulator

Figure 4:
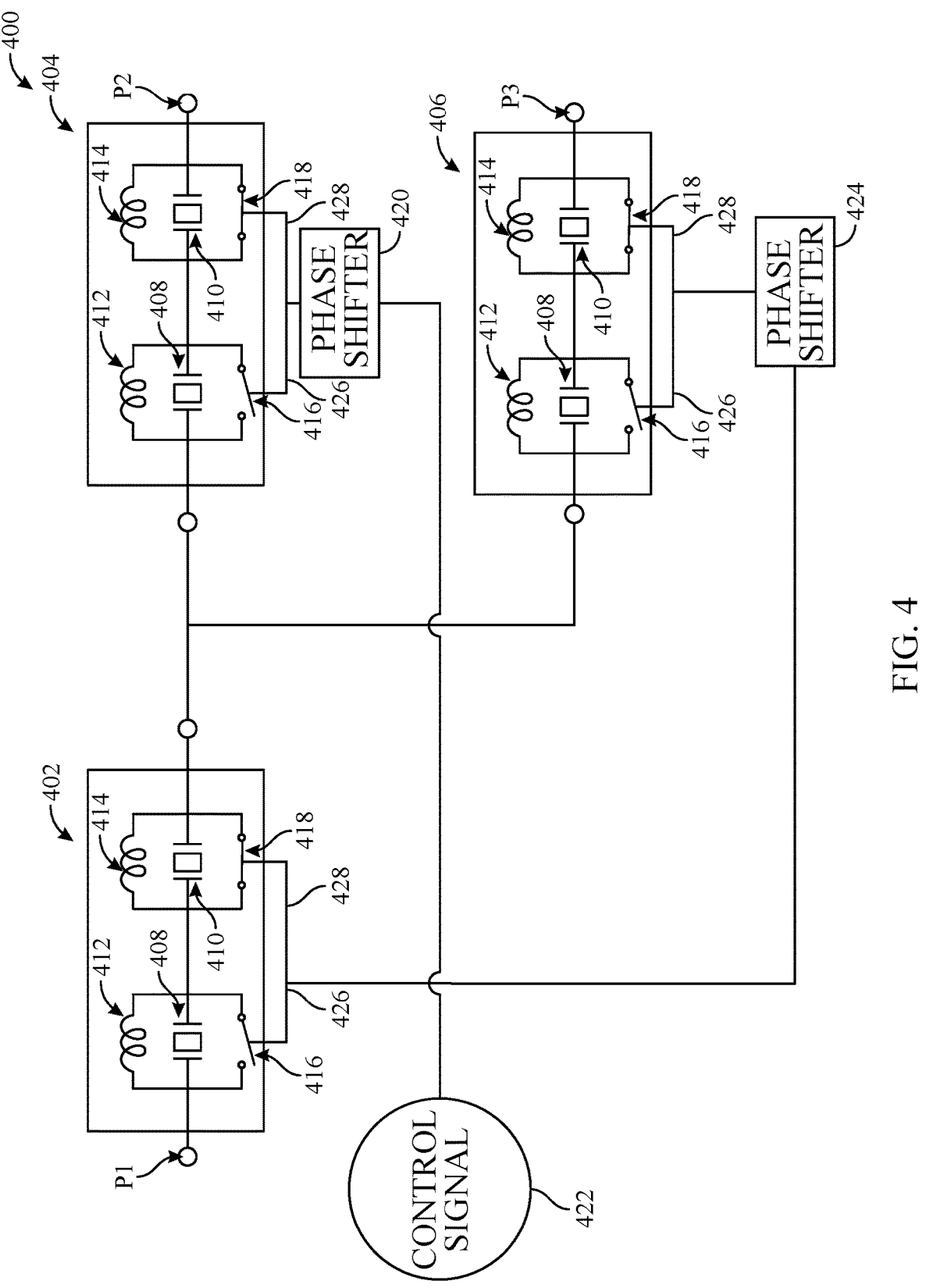
FIG. 4 is a schematic diagram of an example circulator in a first configuration, in accordance with certain aspects of the present disclosure.

FIG. 4 illustrates a circulator 400 according to certain aspects of the present disclosure. The circulator 400 may be implemented as the circulator 309 of FIG. 3 to allow radio frequency signals to travel along one path (e.g., transmit path 302 of FIG. 3 or receive path 304 of FIG. 3). In this manner, the circulator 400 may control the flow of signals and minimize interference (e.g., by supporting a cancellation technique) between different components of an electronic device (e.g., UE 120a in FIG. 1) in which the circulator 400 is included. The circulator 400 includes a plurality of ports. For example, the circulator 400 includes a first port P1 coupled to the transmit chain (e.g., the transmit chain 302 of FIG. 3), a second port P2 coupled to the antenna (e.g., the antenna 306 of FIG. 3), and a third port P3 coupled to the receive chain (e.g., the receive chain 304 of FIG. 3).

The circulator 400 further includes a plurality of branches coupled between the ports (e.g., first port P1, second port P2, third port P3). For example, the circulator 400 includes a first branch 402, a second branch 404, and a third branch 406. The plurality of branches of the circulator 400 may be arranged in any suitable topology. For example, the plurality of branches may be arranged in a first configuration (e.g., star/wye configuration) as depicted in FIG. 4. Alternatively, the plurality of branches may be arranged in a second configuration (e.g., a delta configuration) as depicted in circulator 500 of FIG. 5.

As shown, each of the plurality of branches (e.g., first branch 402, second branch 404, third branch 406) of the circulator 400 includes a first acoustic wave resonator 408 and a second acoustic wave resonator 410 coupled in series with the first acoustic wave resonator 408. The first acoustic wave resonator 408 has a first series resonant frequency, whereas the second acoustic wave resonator 410 has a second series resonant frequency that is different from the first series resonant frequency. In this manner, an operating passband for the circulator 400 is defined. In certain aspects of the present disclosure, the first acoustic wave resonator 408 may be a first bulk acoustic wave (BAW) resonator and the second acoustic wave resonator 410 may be a second BAW resonator. More specifically, the first BAW resonator and the second BAW resonator may each be a film BAW.

The first acoustic wave resonator 408 and the second acoustic wave resonator 410 may each have a high quality factor (e.g., ratio of center frequency of subject resonator to bandwidth of subject resonator). In this manner, the design of the circulator 400 can be improved (e.g., lower insertion loss at high frequencies) compared to conventional circulators as the first acoustic wave resonator 408 and the second acoustic wave resonator 410 of the disclosed circulator 400 can replace lumped element resonators (e.g., inductors and capacitors) and varactor diodes that are used in each branch of conventional circulators.

Each of the plurality of branches of the circulator 400 includes a first inductive element 412 coupled in parallel with the first acoustic wave resonator 408. Each of the plurality of branches of the circulator 400 also includes a second inductive element 414 coupled in parallel with the second acoustic wave resonator 410. The first inductive element 412 and the second inductive element 414 each may have a low quality factor (e.g., ratio of inductive reactance to resistance). In this manner, the first inductive element 412 and the second inductive element 414 do not impact (e.g., degrade) the high quality factor of the series resonance of the first acoustic wave resonator 408 and the series resonance of the second acoustic wave resonator 410, respectively.

Furthermore, the first inductive element 412 and the second inductive element 414 detune a parallel resonance of the first acoustic wave resonator 408 and the second acoustic wave resonator 410, respectively, at an operating frequency (e.g., first series resonant frequency, second series resonant frequency) such that the first acoustic wave resonator 408 and the second acoustic wave resonator 410 operate only as a series resonator at the operating frequency.

In this manner, by detuning the parallel resonance of the first acoustic wave resonator 408, the first inductive element 412 may prevent a degradation in the performance of the circulator 400 that is caused by a delta (e.g., difference) between the series resonance of the first acoustic wave resonator 408 and the parallel resonance of the first acoustic wave resonator 408 at the desired frequency (e.g., first series resonant frequency). Likewise, by detuning the parallel resonance of the second acoustic wave resonator 410, the second inductive element 414 prevents a degradation in the performance of the circulator that is caused by a delta between the series resonance of the second acoustic wave resonator 410 and the parallel resonance of the second acoustic wave resonator 410 at the desired frequency (e.g., second series resonant frequency).

In certain aspects of the present disclosure, the first acoustic wave resonator 408 and the second acoustic wave resonator 410 may each have the same static capacitance to avoid toggling the impedances of each respective acoustic wave resonator. In such aspects of the present disclosure, the first inductive element 412 and the second inductive element 414 are the same. In other aspects of the present disclosure, the value of the first inductive element 412 may differ from the value of the second inductive element 414.

Each of the plurality of branches includes a first switching device 416 coupled in parallel with the first acoustic wave resonator 408 and operable to selectively bypass the first acoustic wave resonator 408. Each of the plurality of branches also includes a second switching device 418 coupled in parallel with the second acoustic wave resonator 410 and operable to selectively bypass the second acoustic wave resonator 410.

This parallel arrangement of the first switching device 416 and the second switching device 418 relative to the first acoustic wave resonator 408 and the second acoustic wave resonator 410, respectively, minimizes the number of switching devices needed in each respective branch of the circulator 400 and thus the effect of additional switching losses on the performance of the circulator 400.

As will be discussed below in more detail, toggling the first switching device 416 and the second switching device 418 in each respective branch of the circulator 400 creates a time-varying passband in each respective branch of the circulator 400.

In certain aspects of the present disclosure, the first switching device 416 and the second switching device 418 of the second branch 404 of the circulator 400 are configured to be controlled with a first phase offset (e.g., implemented by a phase shifter 420) with respect to the first switching device 416 and the second switching device 418 of the first branch 402 of the circulator 400. For example, a control signal 422 (e.g., pulse wave) provided to the first switching device 416 and the second switching device 418 of the first branch 402 of the circulator 400 is phase-shifted according to the first phase offset before being provided to the first switching device 416 and the second switching device 418 of the second branch 404 of the circulator 400. The first phase offset may, for example, be 120 degrees such that the control signal 422 provided to the first switching device 416 and the second switching device 418 of the second branch 404 is 120 degrees out of phase relative to the control signal 422 provided to the first switching device 416 and the second switching device 418 of the first branch 402 of the circulator 400.

Furthermore, the first switching device 416 and the second switching device 418 of the third branch 406 of the circulator 400 are configured to be controlled with a second phase offset (e.g., implemented by phase shifter 424) with respect to the first switching device 416 and the second switching device 418 of the first branch 402 of the circulator 400. For example, the control signal 422 provided to the first switching device 416 and the second switching device 418 of the first branch 402 of the circulator 400 is phase-shifted according to the second phase offset before being provided to the first switching device 416 and the second switching device 418 of the third branch 406 of the circulator 400. The second phase offset may be 240 degrees such that the control signal 422 provided to the first switching device 416 and the second switching device 418 of the third branch 406 is 240 degrees out of phase relative to the control signal 422 provided to the first switching device 416 and the second switching device 418 of the first branch 402 of the circulator 400.

In certain aspects of the present disclosure, a first control signal 426 and a second control signal 428 that is different from the first control signal 426 may be provided to the first switching device 416 and the second switching device 418, respectively, of each of the plurality of branches of the circulator 400. For example, the first control signal 426 provided to the first switching device 416 of each respective branch of the circulator 400 may be the control signal 422 discussed above, whereas the second control signal 428 provided to the second switching device 418 of each respective branch of the circulator 400 may be an inverse of the control signal 422 discussed above. Furthermore, the first control signal 426 and the second control signal 428 provided to the first switching device 416 and second switching device 418 of the second branch 404 and the third branch 406 may have the associated phase offset. More particularly, the first control signal 426 and the second control signal 428 provided to the first switching device 416 and the second switching device 418 of the second branch 404, respectively, may have the first phase offset (e.g., 120 degrees). Additionally, the first control signal 426 and the second control signal 428 provided to the first switching device 416 and the second switching device 418 of the third branch 406, respectively, may have the second phase offset (e.g., 240 degrees).

Figure 5:
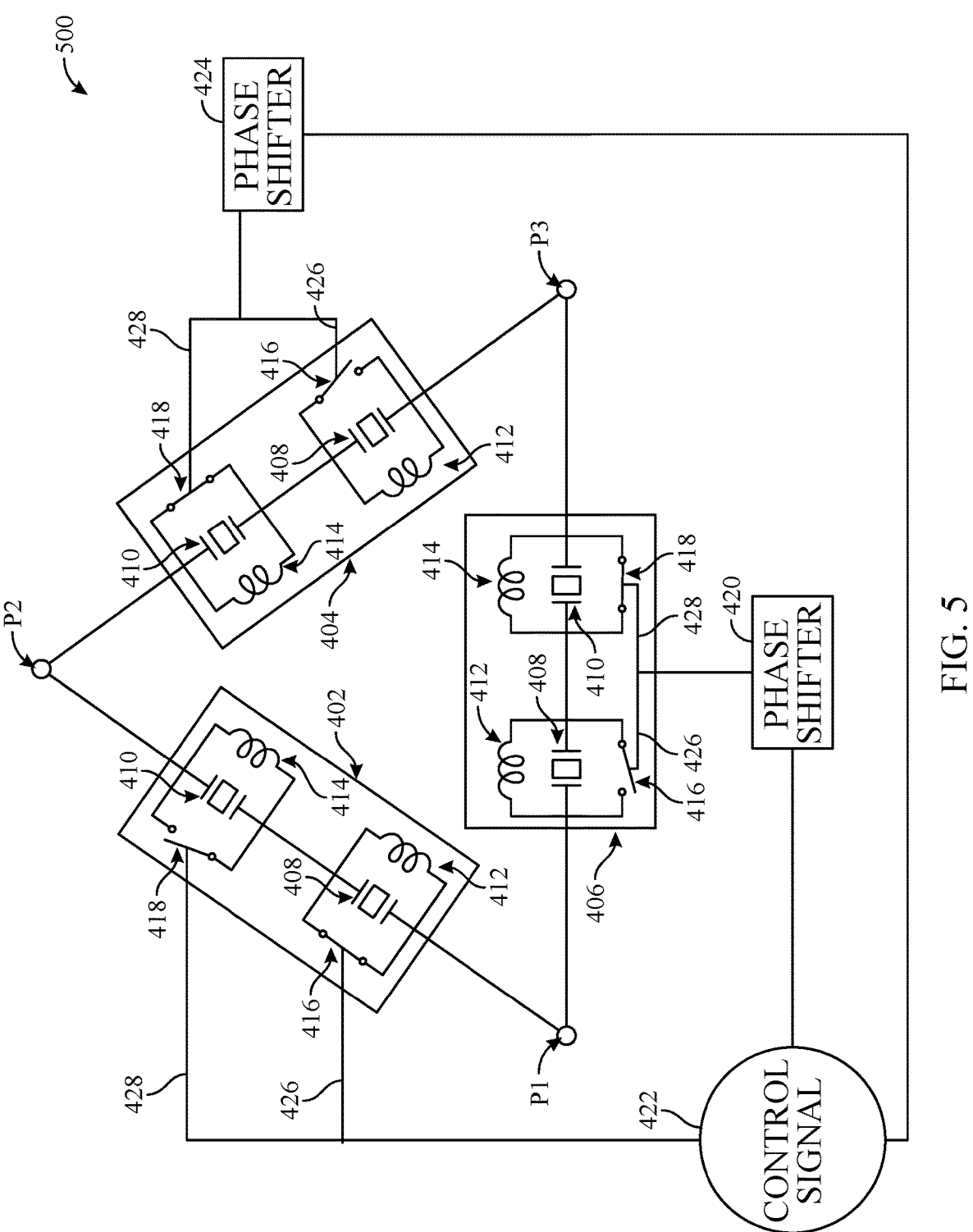
FIG. 5 illustrates an example circulator in a second configuration, in accordance with certain aspects of the present disclosure.

By controlling the first switching device 416 of each respective branch of the circulator 400 according to the first control signal 426 and controlling the second switching device 418 of each respective branch of the circulator 400 according to the second control signal 428, the first switching device 416 and the second switching device 418 are operated such that only one acoustic wave resonator (e.g., first acoustic wave resonator 408 or second acoustic wave resonator 410) in each respective branch of the circulator 400 is bypassed at a time. For example, as shown in FIGS. 4 and 5, the first switching device 416 of each respective branch of the circulators 400/500 may be in a first state (e.g., open), whereas the second switching device 418 of each respective branch of the circulators 400/500 may be in a second state (e.g., closed).

In this manner, only one acoustic wave resonator, specifically the second acoustic wave resonator 410, is bypassed in each respective branch of the circulator 400. To switch from bypassing the second acoustic wave resonator 410 in each respective branch of the circulator 400 to bypassing the first acoustic wave resonator 408 in each respective branch of the circulator 400, the first switching device 416 and the second switching device 418 of each respective branch of the circulator 400 may switch states. More particularly, the first control signal 426 may control the first switching device 416 of each respective branch of the circulator 400 to switch from the first state (e.g., open) to the second state (e.g., closed). Additionally, the second control signal 428 may control the second switching device 418 of each respective branch of the circulator 400 to switch from the second state (e.g., closed) to the first state (e.g., open).

Figure 6:
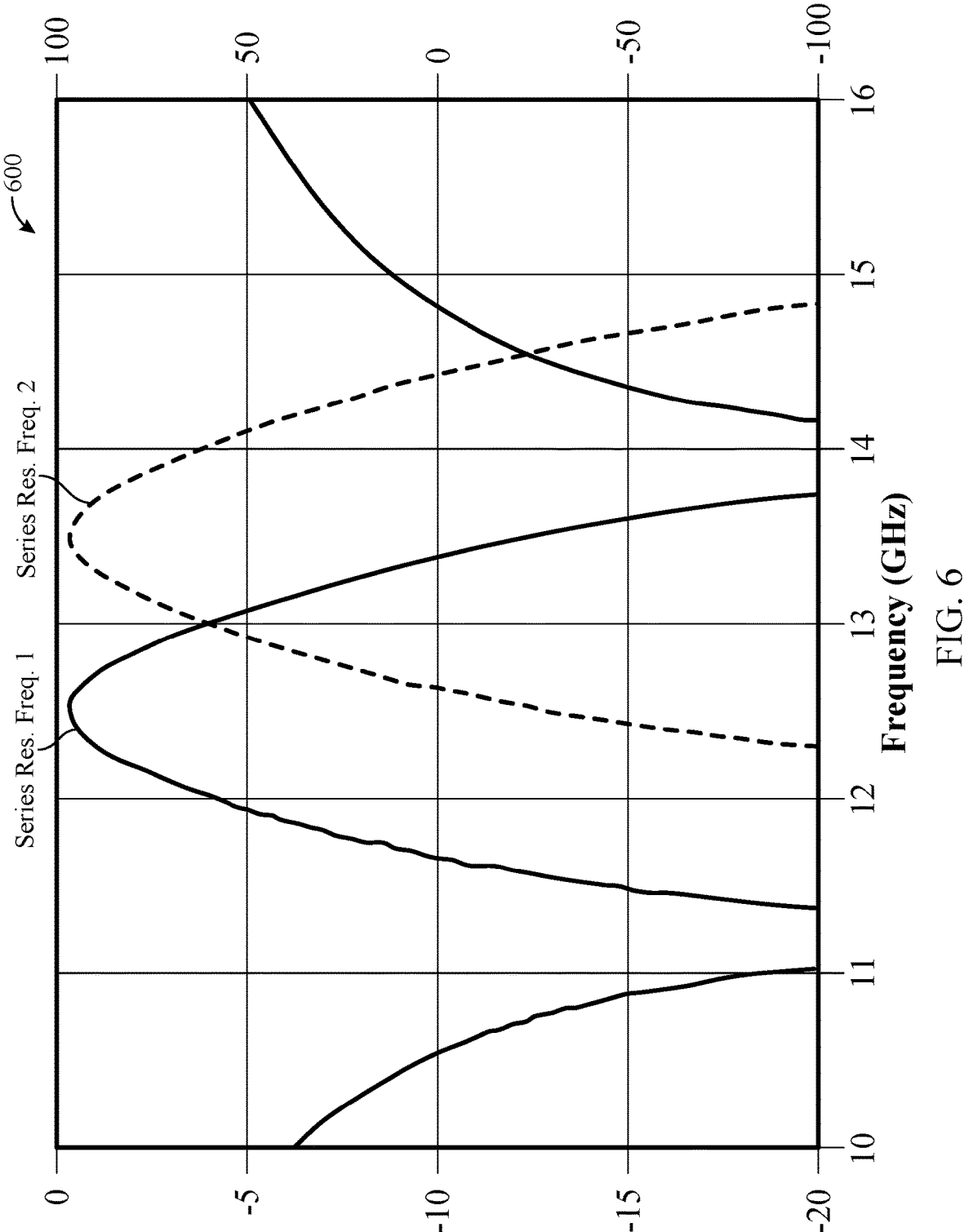
FIG. 6 is a graphical representation of modulation of acoustic wave resonators in one branch of a circulator, in accordance with certain aspects of the present disclosure.

FIG. 6 illustrates a graph 600 of the fixed resonant frequencies for the two or more acoustic wave resonators included in one branch of a circulator according to certain aspects of the present disclosure. For example, the graph 600 depicts a first signal Series Res Freq 1 that is representative of the first series resonant frequency of the first acoustic wave resonator 408 of the circulators 400, 500 discussed above with reference to FIGS. 4 and 5. The graph 600 also depicts a second signal Series Res Freq 2 that is representative of the second series resonant frequency of the second acoustic wave resonator 410 of the circulator 400.

As shown, the first series resonant frequency is different (e.g., lower) than the second series resonant frequency Furthermore, although the graphical representation is only of one branch of the circulator 400, 500, the graph 600 would generally be the same for every other branch of the circulator 400, 500. In operation, the first switching device 416 and the second switching device 418 included in each respective branch of the circulator 400, 500 would be iteratively toggled to selectively bypass the first acoustic wave resonator 408 and the second acoustic wave resonator 410 one at a time to generate the first signal Series Res. Freq. 1 and the second signal Series Res. Freq. 2.

Figure 7:
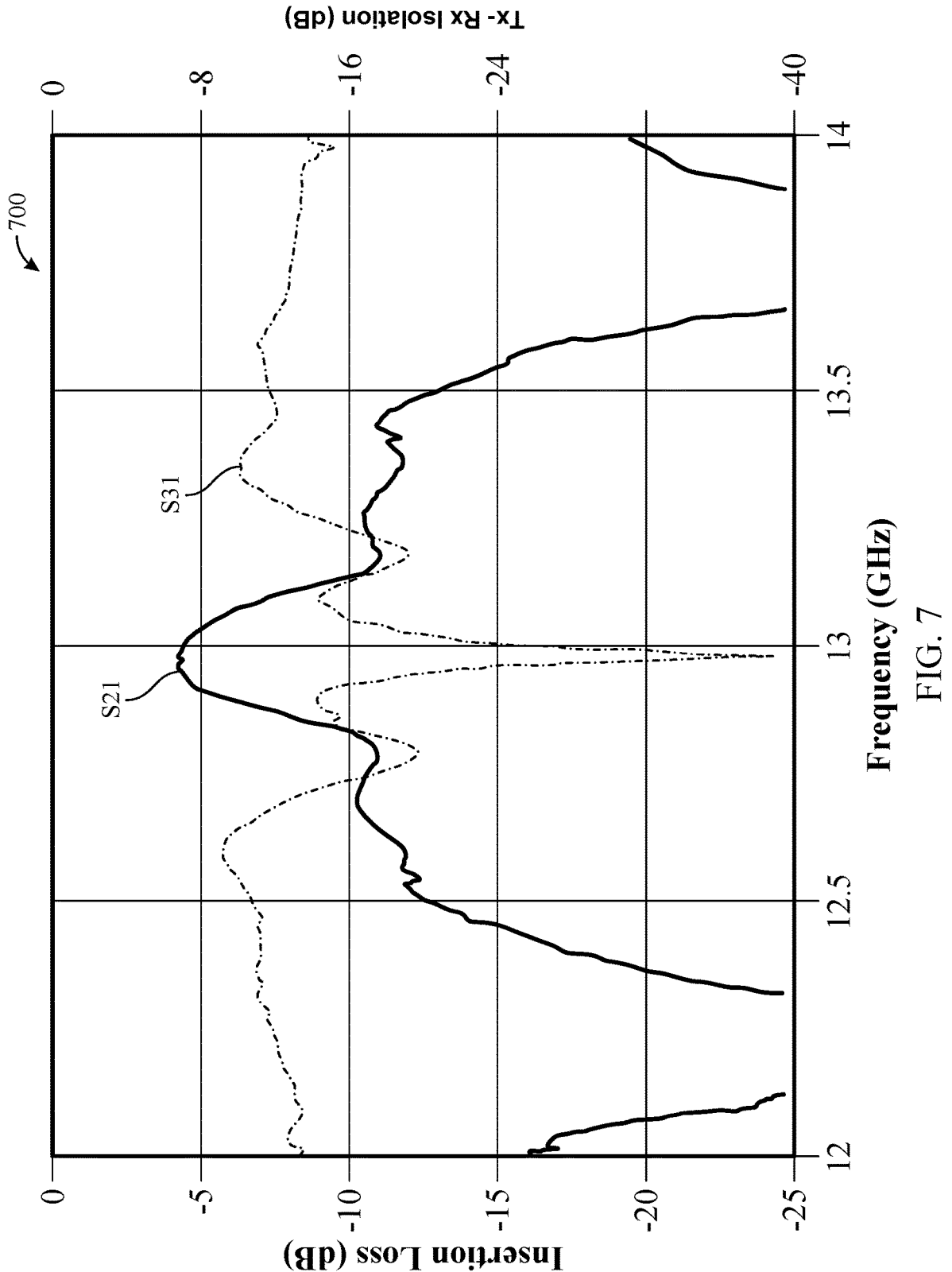
FIG. 7 is a graphical representation of a frequency response of a circulator, in accordance with certain aspects of the present disclosure.

FIG. 7 illustrates a graph 700 indicative of performance of a circulator (e.g., the circulator 400 of FIGS. 4 and 5) according to certain aspects of the present disclosure. The horizontal axis of the graph 700 denotes frequency (e.g., measured in gigahertz) and the vertical axis (e.g., the left side of the graph 700) denotes insertion loss in decibels between the first port of the circulator and the second port of the circulator that connect a transmit chain (e.g., the transmit path 302 of FIG. 3) to an antenna (e.g., then antenna 306 of FIG. 3) as well as insertion loss in decibels between the second port of the circulator and the third port of the circulator that connect the antenna to a receive chain (e.g., the receive path 304 of FIG. 3). The vertical axis (e.g., the right side of the graph 700) also denotes isolation in decibels between the first port of the circulator that is connected to the transmit chain (e.g., the transmit path 302 of FIG. 3) and the third port of the circulator that is connected to the receive chain (e.g., the receive path 304 of FIG. 3) in decibels.

The graph 700 includes a first signal S21 that is indicative of an insertion loss between the first port P1 of the circulator 400, 500 and the second port P2 of the circulator 400, 500. For instance, the first port P1 may be coupled to a transmit chain (e.g., the transmit path 302 of FIG. 3) and the second portion P2 of the circulator 400 may be coupled to an antenna (e.g., antenna 306 of FIG. 3).

The graph 700 includes a second signal S31 that is indicative of an insertion loss between the first port P1 of the circulator 400 and the third port P3 of the circulator 400, 500 that is coupled to a receive chain (e.g., receive path 304 in FIG. 3). Thus, the second signal S31 is indicative of isolation between the first port P1 of the circulator 400 that is coupled to the transmit chain (e.g., transmit path 302 in FIG. 3) and the third port P3 of the circulator 400, 500. As shown, the second signal S31 includes a stopband. Thus, the circulator 400, 500 attenuates frequencies within the stopband to isolate the third port P3 from the first port P1. In this manner, the circulator 400, 500 prevents signals for transmission that enter the first port P1 of the circulator 400, 500 from traveling to third port P3 of the circulator 400, 500 and instead must travel to routes the signals to the second port P2 of the circulator 400, 500 that is coupled to the antenna.

Example Operations for Routing Signals Using a Circulator

FIG. 8 is a flow diagram of example operations 800 for routing signals in an electronic device that includes a circulator, in accordance with certain aspects of the present disclosure. The operations 800 may be performed, for example, using the circulator 400, 500 discussed above with reference to FIGS. 4 and 5.

The operations 800 may begin, at block 802, with routing a first signal from a transmit chain (e.g., the transmit path 302 in FIG. 3) to an antenna (e.g., the antenna 306 in FIG. 3) using the circulator 400, 500. For instance, the first switching device 416 and the second switching device 418 in each of the first branch 402 and the second branch 404 may be iteratively toggled as described above to create a passband (e.g., the passband 604 in FIG. 7) that corresponds to a frequency of the first signal. In this manner, the circulator 400, 500 may route the first signal from the transmit chain to the antenna. Furthermore, the first switching device 416 and the second switching device 418 in the third branch 406 of the circulator 400, 500 may be iteratively toggled to create a stopband that corresponds with the passband. In this manner, the circulator 400, 500 prevents the first signal from traveling from the transmit chain 302 to the receive chain 304.

The operations 800 may continue, at block 804, with routing a second signal from the antenna to the receive chain. For instance, the first switching device 416 and the second switching device 418 of the second branch 404 (e.g., coupled to the antenna) of the circulator 400, 500 and the first switching device 416 and the second switching device 418 of the third branch 406 (e.g., coupled to the receive chain) of the circulator 400 may be iteratively toggled to create a passband that includes a frequency of the second signal. In this manner, the circulator 400, 500 may route the second signal from the antenna to the receive chain. Furthermore, the first switching device 416 and the second switching device 418 in the first branch 402 of the circulator 400, 500 may be iteratively toggled to create a stopband that corresponds to the passband. In this manner, the circulator 400, 500 prevents the second signal from traveling from the antenna to the transmit chain.

Example Aspects

In addition to the various aspects described above, specific combinations of aspects are within the scope of the present disclosure, some of which are detailed below:

Aspect 1: A circulator comprising: a plurality of branches, each of the plurality of branches comprising: a first acoustic wave resonator; a second acoustic wave resonator coupled in series with the first acoustic wave resonator; a first switching device coupled in parallel with the first acoustic wave resonator; and a second switching device coupled in parallel with the second acoustic wave resonator.

Aspect 2: The circulator of Aspect 1, wherein the first acoustic wave resonator has a first series resonant frequency, and the second acoustic wave resonator has a second series resonant frequency that is different from the first series resonant frequency.

Aspect 3: The circulator of Aspect 1 or 2, wherein the first acoustic wave resonator comprises a first bulk acoustic wave (BAW) resonator, and the second acoustic wave resonator comprises a second BAW resonator.

Aspect 4: The circulator of any of Aspects 1 to 3, wherein the first switching device is operable to selectively bypass the first acoustic wave resonator, the second switching device is operable to selectively bypass the second acoustic wave resonator. Furthermore, the first switching device and the second switching device are configured to be operated such that the first acoustic wave resonator and the second acoustic wave resonator are bypassed in an alternating manner at a modulating frequency.

Aspect 5: The circulator of any of Aspects 1 to 4, wherein the first switching device of a first branch of the plurality of branches is configured to be controlled with a first phase offset with respect to the first switching device of a second branch of the plurality of branches; wherein the first switching device of a third branch of the plurality of branches is configured to be controlled with a second phase offset with respect to the first switching device of the second branch of the plurality of branches; and wherein the first phase offset differs from the second phase offset.

Aspect 6: The circulator of any of Aspects 1 to 5, wherein the first switching device and the second switching device in a first branch of the plurality of branches are configured to receive a first control signal and an inverse of the first control signal, respectively; wherein the first switching device and the second switching device in a second branch of the plurality of branches are configured to receive a second control signal and an inverse of the second control signal, respectively; wherein the second control signal is 120 degrees out of phase relative to the first control signal; wherein the first switching device and the second switching device in a third branch of the plurality of branches are configured to receive a third control signal and an inverse of the third control signal, respectively; and wherein the third control signal is 240 degrees out of phase relative to the first control signal.

Aspect 7: The circulator of any of Aspects 1 to 6, wherein each of the plurality of branches further comprises: a first inductive element coupled in parallel with the first acoustic wave resonator; and a second inductive element coupled in parallel with the second acoustic wave resonator.

Aspect 8: The circulator of any of Aspects 1 to 7, wherein the plurality of branches are arranged in a star configuration.

Aspect 9: The circulator of any of Aspects 1 to 7, wherein the plurality of branches are arranged in a delta configuration.

Aspect 10: A method for routing signals in an electronic device supporting wireless communication. The method comprising: routing a first signal from a transmit chain to an antenna using a circulator of the electronic device, the circulator comprising a plurality of branches, each of the plurality of branches comprising: (i) a first acoustic wave resonator having a first series resonant frequency, (ii) a second acoustic wave resonator coupled in series with the first acoustic wave resonator and having a second series resonant frequency that is different from the first series resonant frequency, (iii) a first switching device coupled in parallel with the first acoustic wave resonator, and (iv) a second switching device coupled in parallel with the second acoustic wave resonator; and routing a second signal from the antenna to a receive chain using the circulator.

Aspect 11: The method of Aspect 10, wherein the first signal and the second signal are in a frequency band ranging from 7 gigahertz (GHz) to 24 GHz.

Aspect 12: The method of Aspects 10 or 11, wherein routing the first signal from the transmit chain to the antenna, or routing the second signal from the antenna to the receive chain, using the circulator comprises: toggling the first switching device and the second switching device in each respective branch of the plurality of branches in an alternating manner at a modulating frequency such that only the first acoustic wave resonator in each respective branch of the plurality of branches is bypassed during a first interval of time and only the second acoustic wave resonator in each respective branch of the plurality of branches is bypassed during a second interval of time occurring after the first interval of time.

Aspect 13: The method of Aspect 12, wherein the toggling comprises: providing a first control signal and an inverse of the first control signal to the first switching device and the second switching device, respectively, in a first branch of the plurality of branches; providing a second control signal and an inverse of the second control signal to the first switching device and the second switching device, respectively, in a second branch of the plurality of branches, the second control signal being 120 degrees out of phase relative to the first control signal; and providing a third control signal and an inverse of the third control signal to the first switching device and the second switching device, respectively, in a third branch of the plurality of branches, the third control signal being 240 degrees out of phase relative to the first control signal.

Aspect 14: An apparatus comprising: a transmit chain; a receive chain; an antenna; and a circulator comprising: a first port coupled to the transmit chain; a second port coupled to the antenna; a third port coupled to the receive chain; and a plurality of branches coupled between the first port, the second port, and the third port, each of the plurality of branches comprising: a first acoustic wave resonator; a second acoustic wave resonator coupled in series with the first acoustic wave resonator; a first switching device coupled in parallel with the first acoustic wave resonator; and a second switching device coupled in parallel with the second acoustic wave resonator.

Aspect 15: The apparatus of Aspect 14, wherein the first acoustic wave resonator has a first series resonant frequency; and the second acoustic wave resonator has a second series resonant frequency that is different from the first series resonant frequency.

Aspect 16: The apparatus of Aspect 14 or 15, wherein the first acoustic wave resonator comprises a first bulk acoustic wave (BAW) resonator; and the second acoustic wave resonator comprises a second BAW resonator.

Aspect 17: The apparatus of any of Aspects 14 to 16, wherein each of the plurality of branches further comprises: a first inductive element coupled in parallel with the first acoustic wave resonator; and a second inductive element coupled in parallel with the second acoustic wave resonator.

Aspect 18: The apparatus of any of Aspects 14 to 17, wherein the first switching device and the second switching device are configured to be operated such that the first acoustic wave resonator and the second acoustic wave resonator are bypassed in an alternating manner at a modulating frequency.

Aspect 19: The apparatus of any of Aspects 14 to 18, wherein: the first switching device of a first branch of the plurality of branches is configured to be controlled with a first phase offset with respect to the first switching device of a second branch of the plurality of branches; the first switching device of a third branch of the plurality of branches is configured to be controlled with a second phase offset with respect to the first switching device of the second branch of the plurality of branches; and the first phase offset differs from the second phase offset.

Aspect 20: The apparatus of any of Aspects 14 to 19, wherein the plurality of branches are arranged in a star configuration such that a first branch of the plurality of branches is coupled between the first port and a common node, a second branch of the plurality of branches is coupled between the second port and the common node, and a third branch of the plurality of branches is coupled between the third port and the common node.

CONCLUSION

Described herein is a circulator that includes a plurality of branches, with each of the branches including at least a first acoustic wave resonator and a second acoustic wave resonator coupled in series with the first acoustic wave resonator. The first acoustic wave resonator and the second acoustic wave resonator have different fixed frequencies (e.g., first series resonant frequency and second series resonant frequency). Each of the branches further includes a first switching device coupled in parallel with the first acoustic wave resonator and a second switching device coupled in parallel with the second acoustic wave resonator. The first switching device and the second switching device may be toggled to selectively bypass the first acoustic wave resonator and the second acoustic wave resonator, respectively. In this manner, circulators according to certain aspects of the present disclosure do not require lossy and/or non-linear circuit elements that are required in conventional circulators to modify the resonant frequency of a single resonator. Furthermore, since the first switching device and the second switching device are coupled in parallel with the first acoustic wave resonator and the second acoustic wave resonator, the first and second switching devices do not affect (e.g., degrade) the high quality factor of the first acoustic wave resonator and the second acoustic wave resonator.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A circulator comprising:
  a plurality of branches, each of the plurality of branches comprising:
    a first acoustic wave resonator having a first series resonant frequency;
    a second acoustic wave resonator coupled in series with the first acoustic wave resonator, the second acoustic wave resonator having a second series resonant frequency that is different from the first series resonant frequency;
    a first switching device coupled in parallel with the first acoustic wave resonator; and
    a second switching device coupled in parallel with the second acoustic wave resonator.

2. The circulator of claim 1, wherein:
  the first acoustic wave resonator comprises a first bulk acoustic wave (BAW) resonator; and
  the second acoustic wave resonator comprises a second BAW resonator.

3. The circulator of claim 1, wherein:
  the first switching device is operable to selectively bypass the first acoustic wave resonator;
  the second switching device is operable to selectively bypass the second acoustic wave resonator; and
  the first switching device and the second switching device are configured to be operated such that the first acoustic wave resonator and the second acoustic wave resonator are bypassed in an alternating manner at a modulating frequency.

4. The circulator of claim 1, wherein:
  the first switching device of a first branch of the plurality of branches is configured to be controlled with a first phase offset with respect to the first switching device of a second branch of the plurality of branches;
  the first switching device of a third branch of the plurality of branches is configured to be controlled with a second phase offset with respect to the first switching device of the second branch of the plurality of branches; and
  the first phase offset differs from the second phase offset.

5. The circulator of claim 1, wherein:
  the first switching device and the second switching device in a first branch of the plurality of branches are configured to receive a first control signal and an inverse of the first control signal, respectively;
  the first switching device and the second switching device in a second branch of the plurality of branches are configured to receive a second control signal and an inverse of the second control signal, respectively;
  the second control signal is 120 degrees out of phase relative to the first control signal;
  the first switching device and the second switching device in a third branch of the plurality of branches are configured to receive a third control signal and an inverse of the third control signal, respectively; and
  the third control signal is 240 degrees out of phase relative to the first control signal.

6. The circulator of claim 1, wherein each of the plurality of branches further comprises:
  a first inductive element coupled in parallel with the first acoustic wave resonator; and
  a second inductive element coupled in parallel with the second acoustic wave resonator.

7. The circulator of claim 1, wherein the plurality of branches are arranged in a star configuration.

8. The circulator of claim 1, wherein the plurality of branches are arranged in a delta configuration.

9. A method for routing signals in an electronic device supporting wireless communication, comprising:
  routing a first signal from a transmit chain to an antenna using a circulator of the electronic device, the circulator comprising a plurality of branches, each of the plurality of branches comprising: (i) a first acoustic wave resonator having a first series resonant frequency, (ii) a second acoustic wave resonator coupled in series with the first acoustic wave resonator and having a second series resonant frequency that is different from the first series resonant frequency, (iii) a first switching device coupled in parallel with the first acoustic wave resonator, and (iv) a second switching device coupled in parallel with the second acoustic wave resonator, and
  routing a second signal from the antenna to a receive chain using the circulator.

10. The method of claim 9, wherein the first signal and the second signal are in a frequency band ranging from 7 gigahertz (GHz) to 24 GHz.

11. The method of claim 9, wherein routing the first signal from the transmit chain to the antenna, or routing the second signal from the antenna to the receive chain, using the circulator comprises:
  toggling the first switching device and the second switching device in each respective branch of the plurality of branches in an alternating manner at a modulating frequency such that only the first acoustic wave resonator in each respective branch of the plurality of branches is bypassed during a first interval of time and only the second acoustic wave resonator in each respective branch of the plurality of branches is bypassed during a second interval of time occurring after the first interval of time.

12. The method of claim 11, wherein the toggling comprises:

providing a first control signal and an inverse of the first control signal to the first switching device and the second switching device, respectively, in a first branch of the plurality of branches;

providing a second control signal and an inverse of the second control signal to the first switching device and the second switching device, respectively, in a second branch of the plurality of branches, the second control signal being 120 degrees out of phase relative to the first control signal; and providing a third control signal and an inverse of the third control signal to the first switching device and the second switching device, respectively, in a third branch of the plurality of branches, the third control signal being 240 degrees out of phase relative to the first control signal.

13. An apparatus comprising:

a transmit chain;

a receive chain;

an antenna; and a circulator comprising:

a first port coupled to the transmit chain;

a second port coupled to the antenna;

a third port coupled to the receive chain; and a plurality of branches coupled between the first port, the second port, and the third port, each of the plurality of branches comprising:

a first acoustic wave resonator having a first series resonant frequency;

a second acoustic wave resonator coupled in series with the first acoustic wave resonator, the second acoustic wave resonator having a second series resonant frequency that is different from the first series resonant frequency;

a first switching device coupled in parallel with the first acoustic wave resonator; and a second switching device coupled in parallel with the second acoustic wave resonator.

14. The apparatus of claim 13, wherein:

the first acoustic wave resonator comprises a first bulk acoustic wave (BAW) resonator; and the second acoustic wave resonator comprises a second BAW resonator.

15. The apparatus of claim 13, wherein each of the plurality of branches further comprises:

a first inductive element coupled in parallel with the first acoustic wave resonator; and a second inductive element coupled in parallel with the second acoustic wave resonator.

16. The apparatus of claim 13, wherein the first switching device and the second switching device are configured to be operated such that the first acoustic wave resonator and the second acoustic wave resonator are bypassed in an alternating manner at a modulating frequency.

17. The apparatus of claim 13, wherein:

the first switching device of a first branch of the plurality of branches is configured to be controlled with a first phase offset with respect to the first switching device of a second branch of the plurality of branches;

the first switching device of a third branch of the plurality of branches is configured to be controlled with a second phase offset with respect to the first switching device of the second branch of the plurality of branches; and the first phase offset differs from the second phase offset.

18. The apparatus of claim 13, wherein the plurality of branches are arranged in a star configuration such that a first branch of the plurality of branches is coupled between the first port and a common node, a second branch of the plurality of branches is coupled between the second port and the common node, and a third branch of the plurality of branches is coupled between the third port and the common node.

* * * * *